Feb. 9, 1971 G. BATEMAN 3,562,656
HYBRID SOURCE FOLLOWER AMPLIFIER
Filed April 25, 1969
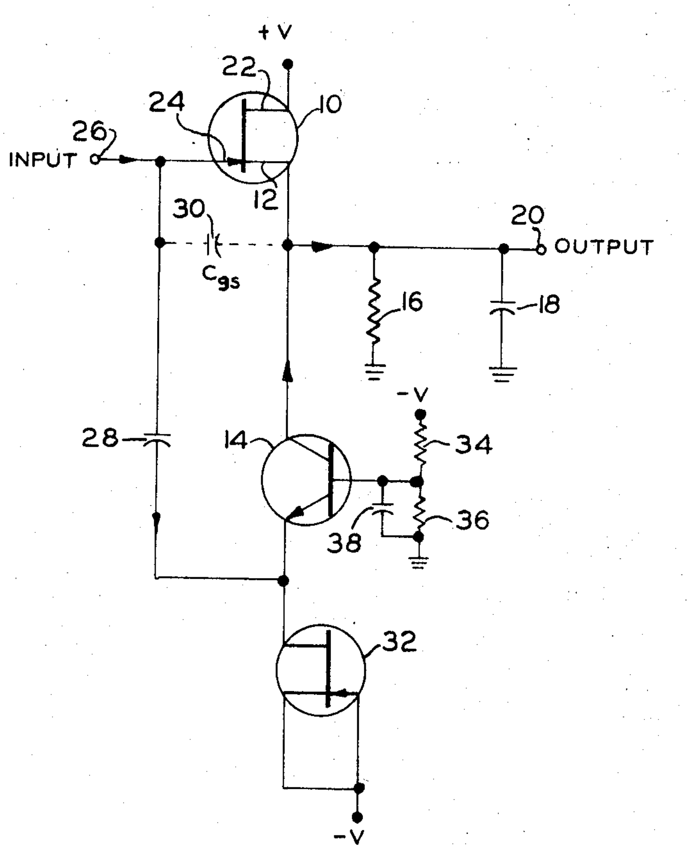
GLENN BATEMAN
*INVENTOR*
*BY*
*BUCKHORN, BLORE, KLARQUIST & SPARKMAN*
*ATTORNEYS*

United States Patent Office 3,562,656
Patented Feb. 9, 1971

3,562,656
HYBRID SOURCE FOLLOWER AMPLIFIER

Glenn Bateman, Portland, Oreg., assignor to Tektronix, Inc., Beaverton, Oreg., a corporation of Oregon Filed Apr. 25, 1969, Ser. No. 819,360
Int. Cl. H03f 3/16, 5/00
U.S. Cl. 330—3 8 Claims

ABSTRACT OF THE DISCLOSURE

A hybrid source follower amplifier is described including a field effect transistor having its source electrode connected to a capacitive load and to the collector of a bipolar transistor and having its gate electrode connected through a "feed-forward" capacitor to the emitter of such bipolar transistor. The feed-forward capacitor is equal to the load capacitance and transmits high frequency input signals from the input to the output of the amplifier through the bipolar transistor along a path which bypasses the internal gate-to-source capacitance of the field effect transistor. This increases the high frequency response and tends to keep the voltage across the gate-to-source capacitance from changing, thereby providing the amplifier with a more constant input capacitance as well as preventing the appearance of a negative input resistance.

BACKGROUND OF THE INVENTION

The subject matter of the present invention relates generally to field effect transistor amplifiers of the source follower amplifier type, and in particular to a hybrid source follower having a capacitive load and including a bipolar transistor having its collector connected to the source of the field effect transistor. The hybrid source follower amplifier of the present invention employs a feed-forward capacitor connected between the gate input of the field effect transistor and the emitter of the bipolar transistor in order to transmit high frequency input signals from the input to the output of the amplifier through the bipolar transistor along a path which bypasses the internal gate-to-source capacitance of such field effect transistor. The bipolar transistor is connected as a grounded base amplifier and the capacitance of the feed-forward capacitor is equal to that of the load capacitance so that no voltage change is produced across the gate-to-source capacitance by the input signal. As a result the field effect transistor does not limit the high frequency response, and its gate-to-source capacitance is not charged by the input signal and subsequently discharged through the signal source to produce a negative input resistance and vary the input capacitance of the amplifier, as in conventional source follower circuits. Thus the source follower amplifier of the present invention has a greatly increased frequency range or band width due to the better high frequency response of the bipolar transistor. In addition, the input capacitance and input resistance of the amplifier are more constant over such increased frequency range.

The source follower amplifier of the present invention is especially useful as the vertical preamplifier of a cathode ray oscilloscope. Like conventional source follower amplifiers employing a field effect transistor input, the present amplifier has an extremely high input resistance so that it does not load the signal source to which it is connected. The present amplifier also employs a second field effect transistor connected in series with the other transistors to provide temperature compensation and also to increase the gain somewhat. In this respect it is similar to the amplifier shown on page 65 of the book "Field Effect Transistors," published in 1965 by L. J. Sevin of Texas Instruments, Inc., which, however, does not employ the high frequency feed-forward path of the present amplifier. Thus, in addition to these features, the hybrid source follower amplifier of the present invention has a much wider frequency band width than a conventional amplifier using only field effect transistor, due to the greater frequency response of the bipolar transistor employed in the feed-forward path of the present amplifier, as discussed above.

It is therefore one object of the present invention to provide an improved source follower amplifier of wider frequency response.

Another object of the invention is to provide an improved source follower amplifier having a more constant input capacitance and a positive input resistance over a wide frequency range.

An additional object of the present invention is to provide an improved hybrid source follower amplifier including a feed-forward capacitor and a bipolar transistor connected in series to form a high frequency signal path between the input and output of the field effect transistor, bypassing the internal gate-to-source capacitance of the field effect transistor to provide a better high frequency response and to prevent such capacitance from causing changes in the input capacitance and the appearance of a negative input resistance.

Still another object of the present invention is to provide such a hybrid source follower amplifier with a second field effect transistor connected as constant current source in series with the bipolar transistor and the input field effect transistor to provide temperature compensation and near unity voltage gain for such amplifier.

BRIEF DESCRIPTION OF DRAWING

Other objects and advantages of the present invention will be apparent from the following detailed description of the preferred embodiment thereof and from the attached drawing of which:

The figure is a schematic diagram of one embodiment of the hybrid amplifier of the present invention.

DESCRIPTION OF PREFERRED EMBODIMENT

The hybrid amplifier circuit of the present invention includes a field effect transistor 10 with an N-type channel portion, connected as a source follower amplifier having its source electrode 12 connected to the collector of a bipolar transistor 14 of the NPN type connected as a common base amplifier. The source electrode of the field effect transistor is also connected to a capacitive load impedance including a load resistance 16 in parallel with a load capacitance 18 at the output terminal 20 of the amplifier. The load capacitance includes stray capacitance as well as the input capacitance of any load circuit connected to the output terminal 20. The other terminals of the load resistance and the load capacitance are grounded. The drain 22 of the field effect transistor is connected to a source of positive D.C. supply voltage "+V" while the gate electrode 24 of such transistor is connected to the input terminal 26 of the amplifier circuit. Thus, the field effect transistor 10 is connected as a source follower amplifier.

A feed-forward means including bipolar transistor and an A.C. coupling capacitor 28 is provided to transmit the high frequency input signals from the input terminal 26 to the output terminal 20 through a path which bypasses the internal gate-to-source capacitance 30 of the field effect transistor 10 to increase the high frequency response of the amplifier as hereafter discussed. The gate-to-source capacitance $C_{gs}$ of the field effect transistor 10, as shown by the dashed lines, is connected in series with the load capacitance 18. Thus in a conventional source follower circuit not employing a feed-forward means, the field effect transistor limits the high frequency response, and the gate-to-source capacitance charges when a high frequency signal is transmitted from the input to the output terminal. This charging of the capacitance produces a voltage difference across the gate and source electrodes of the field effect transistor which tends to vary the input capacitance of the source follower amplifier, and provides it with a negative input resistance when the capacitance discharges back through the signal source connected to input terminal 26.

These problems are avoided in the present invention by the high frequency bypass path around the gate-to-source capacitance 30 provided by the feed-forward capacitor 28 which is connected between the input terminal 26 and the emitter of bipolar transistor 14. Thus if the capacitance of the feed-forward capacitor 28 is made equal to the load capacitance 18, the A.C. gain of the high frequency signal transmitted through the feed-forward path from capacitor 28 to load capacitor 18 is approximately one. For example, capacitors 28 and 18 may both be about one picofarad. In addition, the low frequency or D.C. gain for signals transmitted through the field effect transistor 10 is nearly unity if the load resistance 16 is much greater than the $1/G_m$ resistance of the field effect transistor. Thus, for typical values of 1000 micromhos for $G_m$ the load resistance 16 should be about 50 kilohms.

As a result of making the gains of both the A.C. signal path (28, 14) and low frequency or D.C. signal path (10) unity, the voltage at the output terminal of the gate-to-source capacitance 30 stays the same as the voltage on the input terminal of such capacitance and there is no change in the voltage across the gate-to-source capacitance. Thus the high frequency response of the present amplifier is determined by that of the bipolar transistor 14, not the field effect transistor 10, so that the amplifier of the present invention has a much wider frequency response.

A second field effect transistor 32 may be employed as a constant current source for the source-to-drain current of the other field effect transistor 10. The drain of such second field effect transistor 32 is connected to the emitter of bipolar transistor 14 and its gate and source electrodes connected together at a source of negative D.C. supply voltage "—V." In addition, the second field effect transistor 32 also provides temperature compensation for the first field effect transistor. Of course, the effect of the constant current source formed by the field effect transistor 32 is to provide a more nearly unity gain for the source follower amplifier.

The bipolar transistor 14 has its base electrode connected to a negative D.C. bias voltage slightly more positive than that applied to its emitter so that such transistor is normally conductive. This bias may be provided by a pair of voltage divider resistors 34 and 36 connected in series between a source of negative D.C. supply voltage "—V" and ground. The base of transistor 14 is connected to the junction of the voltage divider resistors 34 and 36 and a bypass capacitor 38 is connected in parallel with voltage divider resistor 36.

The hybrid amplifier of the present invention produces greatly improved results by combining the advantages of the extremely high input impedance of the field effect transistor and the wide frequency band width of the bipolar transistor.

It will be obvious to those having ordinary skill in the art that many changes may be made in the above described details of the preferred embodiment without departing from the spirit of the invention. For example, the second field effect transistor 32 can be eliminated. Therefore, the scope of the present invention should only be determined by the following claims.

I claim:

1. A hybrid source follower amplifier circuit comprising:
   - a field effect transistor connected as a source follower amplifier with its gate electrode connected to the input terminal of the amplifier circuit and its source electrode connected to the output terminal of said circuit;
   - a bipolar transistor having its collector connected to the source electrode of said field effect transistor;
   - a load impedance connected to said source electrode and the output terminal of said circuit; and
   - feed-forward means for transmitting high frequency input signals from the input terminal through the bipolar transistor to the output terminal along a signal path which bypasses the internal gate-to-source circuit of the field effect transistor.

2. An amplifier circuit in accordance with claim 1 in which the feed-forward means includes a coupling capacitor connected between the gate of said field effect transistor and the emitter of said bipolar transistor.

3. An amplifier circuit in accordance with claim 2 in which the load impedance includes a load capacitance and a load resistance, and the coupling capacitor has a capacitance substantially equal to the total output capacitance of the circuit including said load capacitance.

4. An amplifier circuit in accordance with claim 2 in which the bipolar transistor is connected as a grounded base amplifier.

5. An amplifier circuit in accordance with claim 4 which includes a constant current source connected to the emitter of the bipolar transistor.

6. An amplifier circuit in accordance with claim 5 in which the current source is another field effect transistor having its drain connected to the emitter of the bipolar transistor.

7. An amplifier circuit in accordance with claim 6 in which the other field effect transistor has its gate connected to its source.

8. An amplifier circuit in accordance with claim 6 in which the source-to-drain circuits of the two field effect transistors and the emitter-to-collector circuit of the bipolar transistor are connected in series between a pair of sources of D.C. supply voltage.

References Cited

UNITED STATES PATENTS 3,383,615 5/1968 Mulberger et al. ______ 330—38

NATHAN KAUFMAN, Primary Examiner

U.S. Cl. X.R.

330—24, 38, 151